(12) United States Patent
Tanaka et al.

(10) Patent No.: US 9,268,229 B2
(45) Date of Patent: *Feb. 23, 2016

(54) COMPOSITION FOR FORMING RESIST UNDERLAYER FILM, AND PATTERN-FORMING METHOD

(71) Applicant: JSR CORPORATION, Tokyo (JP)

(72) Inventors: Hiromitsu Tanaka, Tokyo (JP); Junya Suzuki, Tokyo (JP); Masayuki Motonari, Tokyo (JP); Tooru Kimura, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/853,131

(22) Filed: Mar. 29, 2013

(65) Prior Publication Data

US 2013/0256264 A1 Oct. 3, 2013

(30) Foreign Application Priority Data

Mar. 29, 2012 (JP) ................................. 2012-077942
Mar. 21, 2013 (JP) ................................. 2013-058928

(51) Int. Cl.
*G03F 7/09* (2006.01)
*G03F 7/004* (2006.01)
*G03F 7/075* (2006.01)
*H01L 21/312* (2006.01)

(52) U.S. Cl.
CPC ............... *G03F 7/094* (2013.01); *G03F 7/004* (2013.01); *G03F 7/075* (2013.01); *G03F 7/0752* (2013.01); *H01L 21/3121* (2013.01)

(58) Field of Classification Search
CPC ............ H01L 21/3121; H01L 21/3122; H01L 23/293; C09D 5/006; G03F 7/004; G03F 7/075
See application file for complete search history.

(56) References Cited

U.S. PATENT DOCUMENTS

| | | | |
|---|---|---|---|
| 4,910,122 A | 3/1990 | Arnold et al. | |
| 5,158,854 A * | 10/1992 | Imamura et al. | 430/192 |
| 6,183,934 B1 * | 2/2001 | Kawamonzen | 430/270.1 |
| 7,910,283 B2 * | 3/2011 | Ogihara et al. | 430/270.1 |
| 8,343,628 B2 * | 1/2013 | Fukuda et al. | 428/411.1 |
| 2006/0063113 A1 * | 3/2006 | Muramatsu | 430/323 |
| 2009/0069521 A1 * | 3/2009 | Nagai et al. | 526/243 |
| 2010/0255412 A1 * | 10/2010 | Sun | 430/5 |

FOREIGN PATENT DOCUMENTS

| | | |
|---|---|---|
| JP | 59-93448 | 5/1984 |
| JP | 06-012452 | 1/1994 |
| JP | 2004-310019 | 11/2004 |
| JP | 2005-018054 | 1/2005 |

OTHER PUBLICATIONS

Sigma-Aldrich, Product Specification, paga 1 of 1.*
Huntsman, Technical Bulletin Jeffsol Propylene Carbonate, 2007.*
Dow Chemical Company, Ethylene Glycol, 1995.*

* cited by examiner

*Primary Examiner* — Duy Deo
(74) *Attorney, Agent, or Firm* — Oblon, McClelland, Maier & Neustadt, L.L.P.

(57) ABSTRACT

A composition for forming a resist underlayer film includes a polysiloxane, and a solvent composition. The solvent composition includes an organic solvent which includes a compound represented by the following formula (1) or a carbonate compound and which has a standard boiling point of no less than 150.0° C. $R^1$ and $R^2$ each independently represent a hydrogen atom, an alkyl group having 1 to 4 carbon atoms or an acyl group having 1 to 4 carbon atoms. $R^3$ represents a hydrogen atom or a methyl group. n is an integer of 1 to 4. In a case where n is no less than 2, a plurality of $R^3$s are identical or different.

$$R^1\text{-O}\left(\begin{array}{c}R^3\\|\\\text{-CH-}\end{array}\text{O}\right)_n\!\!R^2 \qquad (1)$$

15 Claims, No Drawings

COMPOSITION FOR FORMING RESIST UNDERLAYER FILM, AND PATTERN-FORMING METHOD

CROSS-REFERENCE TO RELATED APPLICATIONS

The present application claims priority under 35 U.S.C. §119 to Japanese Patent Application No. 2012-077942, filed on Mar. 29, 2012, and to Japanese Patent Application No. 2013-058928, filed on Mar. 21, 2013. The contents of these applications are incorporated herein by reference in their entirety.

BACKGROUND OF THE INVENTION

1. Field of the Invention

The present invention relates to a composition for forming a resist underlayer film, and a pattern-forming method.

2. Discussion of the Background

In manufacturing semiconductor devices, multilayer resist processes have been employed in attempts to meet miniaturization of patterns along with enhanced integration. In these processes, a composition for forming a resist underlayer film is first coated on a substrate to provide a resist underlayer film, and then a resist composition is coated on the resist underlayer film to provide a resist film. Thereafter, the resist film is exposed through a photomask by means of a stepping projection aligner (stepper) or the like, and developed with an appropriate developer solution to form a resist pattern. Subsequently, the resist underlayer film is dry-etched using the resist pattern as a mask, and the substrate is further dry-etched using the resultant resist underlayer film pattern as a mask, thereby enabling a desired pattern to be formed on the substrate.

As the composition for forming a resist underlayer film, which enables etching of the resist underlayer film for sure due to having a high etching selectivity with respect to a resist film, compositions containing a polysiloxane have been disclosed (see Japanese Unexamined Patent Application, Publication Nos. 2004-310019 and 2005-018054).

SUMMARY OF THE INVENTION

According to one aspect of the present invention, a composition for forming a resist underlayer film includes a polysiloxane, and a solvent composition. The solvent composition includes an organic solvent which includes a compound represented by a formula (1) or a carbonate compound and which has a standard boiling point of no less than 150.0° C.

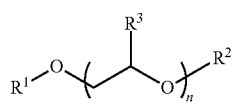

In the formula (1), $R^1$ and $R^2$ each independently represent a hydrogen atom, an alkyl group having 1 to 4 carbon atoms or an acyl group having 1 to 4 carbon atoms. $R^3$ represents a hydrogen atom or a methyl group. n is an integer of 1 to 4. In a case where n is no less than 2, a plurality of $R^3$s are identical or different.

According to another aspect of the present invention, a pattern-forming method includes providing a resist underlayer film on a substrate using the composition. A resist film is provided on the resist underlayer film using a resist composition. The resist film is exposed by irradiation with an exposure light through a photomask. The exposed resist film is developed to form a resist pattern. The resist underlayer film and the substrate are sequentially dry-etched using the resist pattern as a mask.

DESCRIPTION OF THE EMBODIMENTS

According to an embodiment of the present invention, a composition for forming a resist underlayer film contains a polysiloxane (hereinafter, may be also referred to as "polysiloxane (A)"), and a solvent composition (hereinafter, may be also referred to as "solvent composition (B)") containing an organic solvent which includes a compound represented by the following formula (1) or a carbonate compound and has a standard boiling point of no less than 150.0° C. (hereinafter, may be also referred to as "organic solvent (B1)").

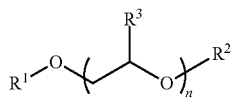

In the formula (1), $R^1$ and $R^2$ each independently represent a hydrogen atom, an alkyl group having 1 to 4 carbon atoms or an acyl group having 1 to 4 carbon atoms; $R^3$ represents a hydrogen atom or a methyl group; n is an integer of 1 to 4, in a case where n is no less than 2, a plurality of $R^3$s are the same or different.

Due to containing the above-specified organic solvent that includes a component having a higher boiling point, the composition for forming a resist underlayer film according to the embodiment of the present invention has superior storage stability enabling a change of a film thickness of the resist underlayer film accompanied by storage of the composition to be decreased, and also has a superior improving property on coating defects enabling hardening of the polymer components dissolving in the composition to be suppressed by prohibiting unwanted evaporation of the solvent in the step of providing a resist underlayer film.

The standard boiling point of the organic solvent (B1) is preferably no less than 180° C. When the standard boiling point of the organic solvent (B1) falls within the above-specified range, the storage stability and the improving property on coating defects of the composition can be improved.

The content of the organic solvent (B1) in the solvent composition (B) is preferably no less than 1% by mass and no greater than 50% by mass. When the content of the organic solvent (B1) in the solvent composition (B) falls within the above-specified range, the storage stability and the improving property on coating defects of the composition can be effectively improved.

The static surface tension of the organic solvent (B1) is preferably no less than 20 mN/m and no greater than 50 mN/m. When the static surface tension of the organic solvent (B1) falls within the above-specified range, the composition can have improved solubility of the polysiloxane (A), and as a result, the improving property on coating defects can be improved.

It is preferred that the solvent composition (B) further includes an alkylene glycol monoalkyl ether acetate compound having a standard boiling point of less than 150.0° C. (hereinafter, may be also referred to as "compound (B2)"). When the solvent composition (B) further includes the above-specified compound (B2), the composition can have improved solubility of the polysiloxane (A) in the solvent composition (B), and as a result, the storage stability and the improving property on coating defects can be further improved.

The alkylene glycol monoalkyl ether acetate compound is preferably a propylene glycol monoalkyl ether acetate compound. When the compound (B2) is the above-specified compound, the composition can have further improved solubility of the polysiloxane (A) in the solvent composition (B), and as a result, the storage stability and the improving property on coating defects can be further improved.

Since the composition for forming a resist underlayer film has the properties described above, it can be suitably used in multilayer resist processes, whereby a resist underlayer film accompanied by fewer coating defects can be provided.

It is preferred that the composition for forming a resist underlayer film further contains an acid diffusion control agent (hereinafter, may be also referred to as "acid diffusion control agent (C)"). When the composition for forming a resist underlayer film further contains the acid diffusion control agent (C), diffusion of an acid which may be caused in the resist film via the resist underlayer film can be effectively inhibited while maintaining the effects described above, and thus the shape of a resist pattern formed by a multilayer resist process can be consequently improved.

The acid diffusion control agent (C) is preferably a nitrogen-containing compound. When the acid diffusion control agent (C) is a nitrogen-containing compound, the composition enables the diffusion to be more effectively inhibited, and as a result, the shape of a resist pattern formed by a multilayer resist process can be further improved.

The polysiloxane (A) is preferably a hydrolytic condensate of a compound that includes a silane compound represented by the following formula (i):

$$R^A_a SiX_{4-a} \quad (i)$$

in the formula (i), $R^A$ represents a hydrogen atom, a fluorine atom, an alkyl group having 1 to 5 carbon atoms, an alkenyl group having 2 to 20 carbon atoms, an aryl group having 6 to 20 carbon atoms or a cyano group, wherein a part or all of hydrogen atoms of the alkyl group represented by $R^A$ are not substituted or substituted by an epoxyalkyloxy group, an acid anhydride group or a cyano group, and a part or all of hydrogen atoms of the aryl group are not substituted or substituted by a hydroxy group; X represents a halogen atom or —$OR^B$, wherein $R^B$ represents a monovalent organic group; a is an integer of 0 to 3, wherein in a case where $R^A$ is present in a plurality of number, the plurality of $R^A$s are each identical or different, and in a case where X is present in a plurality of number, the plurality of Xs are each identical or different.

When the polysiloxane (A) is a hydrolytic condensate of the above-specified compound, the storage stability and the improving property on coating defects of the composition can be further improved.

According to another embodiment of the present invention, a pattern-forming method includes:

providing a resist underlayer film on a substrate using the composition for forming a resist underlayer film;

providing a resist film on the resist underlayer film using a resist composition;

exposing the resist film by irradiation with an exposure light through a photomask;

developing the exposed resist film to form a resist pattern; and sequentially dry-etching the resist underlayer film and the substrate using the resist pattern as a mask.

According to the pattern-forming method of another embodiment of the present invention, due to the composition for forming a resist underlayer film having the properties described above, a favorable resist pattern can be formed.

The "standard boiling point" (hereinafter, may also be merely referred to as "boiling point") as referred to herein means a boiling point at 1 atm. In addition, the "static surface tension" as referred to means a surface tension when the surface of a liquid stands still. The static surface tension herein is a value determined according to a Wilhelmy method at 25° C. Furthermore, the "monovalent organic group" as referred to herein means a monovalent group that includes at least one carbon atom.

As described in the foregoing, the composition for forming a resist underlayer film of the embodiment of the present invention has superior storage stability and a superior improving property on coating defects. Specifically, the variation of the film thicknesses of the resist underlayer films when stored for a long period of time is reduced. In addition, coating defects on/in the resist underlayer film, which result from a solid matter produced by solidification of polymer components dissolved in the compositions, during a formation process of a resist underlayer film, is reduced. Therefore, the composition for forming a resist underlayer film and the pattern-forming method can be suitably used in manufacturing processes of semiconductor devices in which miniaturization of patterns has been in progress. The embodiments will now be described in detail.

Composition for Forming a Resist Underlayer Film

The composition for forming a resist underlayer film of the embodiment of the present invention contains (A) a polysiloxane and (B) a solvent composition. In addition, the composition for forming a resist underlayer film may contain (C) an acid diffusion control agent as a suitable component. Furthermore, the composition for forming a resist underlayer film may contain other optional component as long as it does not impair the effects of the present invention.

It is to be noted that since the composition for forming a resist underlayer film has a superior improving property on coating defects, it can be suitably used in a multilayer resist process demonstrated in connection with the pattern-forming method described later, etc., and can form a resist underlayer film having fewer coating defects. Hereinafter, each component will be explained in detail.

(A) Polysiloxane

The polysiloxane (A) is not particularly limited as long as it is a polymer having a siloxane bond, and is preferably a hydrolytic condensate of a compound that includes the silane compound represented by the formula (i). The term "hydrolytic condensate of a compound that includes a silane compound" as referred to herein means a hydrolytic condensate of the silane compound represented by the formula (i), or a hydrolytic condensate of the silane compound represented by the formula (i) with a silane compound other than the silane compound represented by the formula (i) (hereinafter, may also be referred to as "other silane compound"). The other silane compound is not particularly limited as long as it generates a silanol group via hydrolysis.

In the above formula (i), $R^A$ represents a hydrogen atom, a fluorine atom, an alkyl group having 1 to 5 carbon atoms, an alkenyl group having 2 to 10 carbon atoms, an aryl group having 6 to 20 carbon atoms or a cyano group, wherein a part or all of hydrogen atoms of the alkyl group represented by $R^A$ are not substituted or substituted by an epoxyalkyloxy group, an acid anhydride group or a cyano group, and a part or all of hydrogen atoms of the aryl group are not substituted or substituted by a hydroxy group; X represents a halogen atom or —OR$^B$, wherein R$^B$ represents a monovalent organic group; a is an integer of 0 to 3, wherein in a case where R$^4$ is present in a plurality of number, the plurality of R$^4$s are each identical or different, and in a case where X is present in a plurality of number, the plurality of Xs are each identical or different.

Examples of the alkyl group having 1 to 5 carbon atoms represented by the R$^4$ include linear alkyl groups such as a methyl group, an ethyl group, a n-propyl group, a n-butyl group and a n-pentyl group; branched alkyl groups such as an isopropyl group, an isobutyl group, a sec-butyl group, a t-butyl group and an isoamyl group, and the like. Of these, a methyl group and an ethyl group are preferred, and a methyl group is more preferred.

Examples of the alkenyl group having 2 to 10 carbon atoms represented by the R$^4$ include an ethenyl group, a 1-propen-1-yl group, a 1-propen-2-yl group, a 1-propen-3-yl group, a 1-buten-1-yl group, a 1-buten-2-yl group, a 1-buten-3-yl group, a 1-buten-4-yl group, a 2-buten-1-yl group, a 2-buten-2-yl group, a 1-penten-5-yl group, a 2-penten-1-yl group, a 2-penten-2-yl group, a 1-hexen-6-yl group, a 2-hexen-1-yl group, a 2-hexen-2-yl group, and the like.

Examples of the aryl group having 6 to 20 carbon atoms represented by the R$^4$ include a phenyl group, a naphthyl group, a methylphenyl group, an ethylphenyl group, and the like. Also, the aryl group may be substituted with a halogen atom. The aryl group substituted with a halogen atom is exemplified by a chlorophenyl group, a bromophenyl group, a fluorophenyl group, and the like.

It is to be noted that the "epoxy" as referred to herein includes both oxiranyl and oxetanyl.

Examples of the alkyl group substituted with an epoxyalkyloxy group include oxiranylalkyloxyalkyl groups such as a 2-glycidyloxyethyl group, a 3-glycidyloxypropyl group and a 4-glycidyloxybutyl group; oxetanylalkyloxyalkyl groups such as a 3-ethyl-3-oxetanylmethyloxypropyl group, a 3-methyl-3-oxetanylmethyloxypropyl group, a 3-ethyl-2-oxetanylmethyloxypropyl group and a 2-oxetanylmethyloxyethyl group, and the like. Of these, a 3-glycidyloxypropyl group and a 3-ethyl-3-oxetanylmethyloxypropyl group are preferred.

Examples of the alkyl group substituted with an acid anhydride group include a 2-succinic anhydride group-substituted ethyl group, a 3-succinic anhydride group-substituted propyl group, a 4-succinic anhydride group-substituted butyl group, and the like. Of these, a 3-succinic anhydride group-substituted propyl group is more preferred.

Examples of the alkyl group substituted with a cyano group include a 2-cyanoethyl group, a 3-cyanopropyl group, a 4-cyanobutyl group, and the like.

Examples of the aryl group substituted with a hydroxy group include a 4-hydroxyphenyl group, a 4-hydroxy-2-methylphenyl group, a 4-hydroxynaphthyl group, and the like. Of these, a 4-hydroxyphenyl group is preferred.

Examples of the halogen atom represented by X include a fluorine atom, a chlorine atom, a bromine atom, an iodine atom, and the like.

As the monovalent organic group in the R$^B$, an alkyl group and an alkylcarbonyl group are preferred. The alkyl group is more preferably a methyl group, an ethyl group, a n-propyl group, an isopropyl group, a n-butyl group, a isobutyl group, a sec-butyl group or a t-butyl group, still more preferably a methyl group or an ethyl group, and particularly preferably a methyl group. In addition, as the alkylcarbonyl group, a methylcarbonyl group and an ethylcarbonyl group are more preferred.

Examples of the silane compound represented by the formula (i) include:

aromatic ring-containing trialkoxysilanes such as phenyltrimethoxysilane, 4-methylphenyltrimethoxysilane, 4-ethylphenyltrimethoxysilane, 4-hydroxyphenyltrimethoxysilane, 3-methylphenyltrimethoxysilane, 3-ethylphenyltrimethoxysilane, 3-hydroxyphenyltrimethoxysilane, 2-methylphenyltrimethoxysilane, 2-ethylphenyltrimethoxysilane, 2-hydroxyphenyltrimethoxysilane and 2,4,6-trimethylphenyltrimethoxysilane;

alkyltrialkoxysilanes such as methyltrimethoxysilane, methyltriethoxysilane, methyltri-n-propoxysilane, methyltri-iso-propoxysilane, methyltri-n-butoxysilane, methyltri-sec-butoxysilane, methyltri-t-butoxysilane, methyltriphenoxysilane, methyltriacetoxysilane, methyltrichlorosilane, methyltriisopropenoxysilane, methyltris(dimethylsiloxy)silane, methyltris(methoxyethoxy)silane, methyltris(methylethylketoxime)silane, methyltris(trimethylsiloxy)silane, methylsilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-t-butoxysilane, ethyltriphenoxysilane, ethylbistris(trimethylsiloxy)silane, ethyldichlorosilane, ethyltriacetoxysilane, ethyltrichlorosilane, n-propyltrimethoxysilane, n-propyltriethoxysilane, n-propyltri-n-propoxysilane, n-propyltri-iso-propoxysilane, n-propyltri-n-butoxysilane, n-propyltri-sec-butoxysilane, n-propyltri-t-butoxysilane, n-propyltriphenoxysilane, n-propyltriacetoxysilane, n-propyltrichlorosilane, iso-propyltrimethoxysilane, iso-propyltriethoxysilane, iso-propyltri-n-propoxysilane, iso-propyltri-iso-propoxysilane, iso-propyltri-n-butoxysilane, iso-propyltri-sec-butoxysilane, iso-propyltri-t-butoxysilane, iso-propyltriphenoxysilane, n-butyltrimethoxysilane, n-butyltriethoxysilane, n-butyltri-n-propoxysilane, n-butyltri-iso-propoxysilane, n-butyltri-n-butoxysilane, n-butyltri-sec-butoxysilane, n-butyltri-t-butoxysilane, n-butyltriphenoxysilane, n-butyltrichlorosilane, 2-methylpropyltrimethoxysilane, 2-methylpropyltriethoxysilane, 2-methylpropyltri-n-propoxysilane, 2-methylpropyltri-iso-propoxysilane, 2-methylpropyltri-n-butoxysilane, 2-methylpropyltri-sec-butoxysilane, 2-methylpropyltri-t-butoxysilane, 2-methylpropyltriphenoxysilane, 1-methylpropyltrimethoxysilane, 1-methylpropyltriethoxysilane, 1-methylpropyltri-n-propoxysilane, 1-methylpropyltri-iso-propoxysilane, 1-methylpropyltri-n-butoxysilane, 1-methylpropyltri-sec-butoxysilane, 1-methylpropyltri-t-butoxysilane, 1-methylpropyltriphenoxysilane, t-butyltrimethoxysilane, t-butyltriethoxysilane, t-butyltri-n-propoxysilane, t-butyltri-iso-propoxysilane, t-butyltri-n-butoxysilane, t-butyltri-sec-butoxysilane, t-butyltri-t-butoxysilane, t-butyltriphenoxysilane, t-butyltrichlorosilane and t-butyldichlorosilane;

alkenyltrialkoxysilanes such as vinyltrimethoxysilane, vinyltriethoxysilane, vinyltri-n-propoxysilane, vinyltriisopropoxysilane, vinyltri-n-butoxysilane, vinyltri-sec-butoxysilane, vinyltri-t-butoxysilane, vinyltriphenoxysilane, allyltrimethoxysilane, allyltriethoxysilane, allyltri-n-propoxysilane, allyltriisopropoxysilane, allyltri-n-butoxysilane, allyltri-sec-butoxysilane, allyltri-t-butoxysilane and allyltriphenoxysilane;

tetraalkoxysilanes such as tetramethoxysilane, tetraethoxysilane, tetra-n-propoxysilane, tetra-iso-propoxysilane, tetra-n-butoxysilane, tetra-sec-butoxysilane and tetra-t-butoxysilane;

tetraarylsilanes such as tetraphenoxysilane;

epoxy group-containing silanes such as 3-oxetanylmethyloxypropyltrimethoxysilane, 3-oxetanylethyloxypropyltrimethoxysilane and 3-glycidyloxypropyltrimethoxysilane;

acid anhydride group-containing silanes such as 3-(trimethoxysilyl)propylsuccinic anhydride, 2-(trimethoxysilyl)ethylsuccinic anhydride, 3-(trimethoxysilyl)propylmaleic anhydride and 2-(trimethoxysilyl)ethylglutaric anhydride;

tetrahalosilanes such as tetrachlorosilane; and the like.

Examples of the other silane compound include benzyltrimethoxysilane, phenethyltrimethoxysilane, 4-phenoxyphenyltrimethoxysilane, 4-aminophenyltrimethoxysilane, 4-dimethylaminophenyltrimethoxysilane, 4-acetylaminophenyltrimethoxysilane, 3-methoxyphenyltrimethoxysilane, 3-phenoxyphenyltrimethoxysilane, 3-aminophenyltrimethoxysilane, 3-dimethylaminophenyltrimethoxysilane, 3-acetylaminophenyltrimethoxysilane, 2-methoxyphenyltrimethoxysilane, 2-phenoxyphenyltrimethoxysilane, 2-aminophenyltrimethoxysilane, 2-dimethylaminophenyltrimethoxysilane, 2acetylaminophenyltrimethoxysilane, 4-methylbenzyltrimethoxysilane, 4-ethylbenzyltrimethoxysilane, 4-methoxybenzyltrimethoxysilane, 4-phenoxybenzyltrimethoxysilane, 4-hydroxybenzyltrimethoxysilane, 4-aminobenzyltrimethoxysilane, 4-dimethylaminobenzyltrimethoxysilane, 4-acetylaminobenzyltrimethoxysilane, and the like.

Conditions for permitting the hydrolytic condensation are not particularly limited as long as at least a part of the silane compound represented by the above formula (i) is hydrolyzed to convert a hydrolyzable group (—OR$^B$) into a silanol group, thereby causing a condensation reaction, and the hydrolytic condensation may be carried out as follows, for example.

The water used for the hydrolytic condensation is preferably purified by a procedure such as a treatment with a reverse osmosis membrane, an ion-exchanging treatment or distillation. When such purified water is used, side reactions can be inhibited, thereby enabling a reactivity of the hydrolysis to be improved. The amount of the water used relative to 1 mol of the total amount of hydrolyzable groups of the silane compound represented by the above formula (i) is preferably 0.1 to 3 mol, more preferably 0.3 to 2 mol, and further preferably 0.5 to 1.5 mol. Use of the water in such an amount enables the reaction rate of the hydrolysis and condensation to be optimized.

The solvent which may be used for the hydrolytic condensation is not particularly limited, and is preferably ethylene glycol monoalkyl ether acetate, diethylene glycol dialkyl ether, propylene glycol monoalkyl ether, propylene glycol monoalkyl ether acetate, and propionic acid esters. Among these, diethylene glycol dimethyl ether, diethylene glycol ethyl methyl ether, propylene glycol monomethyl ether, propylene glycol monoethyl ether, propylene glycol monomethyl ether acetate, methyl 3-methoxypropionate, and 4-hydroxy-4-methyl-2-pentanone (diacetone alcohol) are more preferred.

The hydrolytic condensation reaction is preferably carried out in the presence of a catalyst such as a catalyst of an acid (for example, hydrochloric acid, sulfuric acid, nitric acid, formic acid, oxalic acid, acetic acid, trifluoroacetic acid, trifluoromethanesulfonic acid, phosphoric acid, acidic ion exchange resin and various types of Lewis acid), a catalyst of a base (for example, nitrogen-containing compounds such as ammonia, primary amines, secondary amines, tertiary amines and pyridine; basic ion exchange resin; hydroxides such as sodium hydroxide; carbonates such as potassium carbonate; carboxylates such as sodium acetate; and various types of Lewis base), or an alkoxide (for example, zirconium alkoxide, titanium alkoxide and aluminum alkoxide). For example, tri-i-propoxyaluminum may be used as an aluminum alkoxide. The amount of the catalyst used is preferably no greater than 0.2 mol, and more preferably 0.00001 to 0.1 mol relative to 1 mol of a monomer of a hydrolyzable silane compound in light of promotion of the hydrolytic condensation reaction.

The reaction temperature and the reaction time are appropriately set in the hydrolytic condensation. For example, the following conditions may be employed. The reaction temperature is preferably 40° C. to 200° C., and more preferably 50° C. to 150° C. The reaction time is preferably 30 minutes to 24 hours, and more preferably 1 hour to 12 hours. Such a reaction temperature and a reaction time enable the hydrolytic condensation reaction to be most efficiently carried out. In the hydrolytic condensation, the hydrolytic condensation reaction may be carried out in one step by adding a hydrolyzable silane compound, water and a catalyst in the reaction system at one time, or in a multiple step by adding a hydrolyzable silane compound, water and a catalyst in the reaction system at several times. It is to be noted that water and generated alcohol can be removed from the reaction system by adding a dehydrating agent, followed by subjecting the water and the generated alcohol to evaporation after the hydrolytic condensation reaction.

The content of the polysiloxane (A) in the composition for forming a resist underlayer film is preferably no less than 80% by mass, more preferably no less than 90% by mass, and still more preferably no less than 95% by mass with respect to the total solid content in the composition for forming a resist underlayer film. It is to be noted that the composition for forming a resist underlayer film may contain one type alone of the polysiloxane (A), or contain two or more types of the polysiloxane (A).

The polystyrene equivalent weight average molecular weight (Mw) of the polysiloxane (A) as determined on gel permeation chromatography (GPC) is typically 500 to 50,000, preferably 1,000 to 30,000, more preferably 1,000 to 15,000, and still more preferably 1,000 to 5,000.

(B) Solvent

The solvent composition (B) contains (B1) an organic solvent. In addition, the solvent composition (B) may contain (B2) a compound. Furthermore, the solvent composition (B) may contain other solvent excluding the organic solvent (B1) and the compound (B2) in a range not leading to impairment of the effects of the present invention. Each of the components described above may be used either alone or in combination of two or more types thereof. Each component will be described in detail below.

(B1) Organic Solvent

The organic solvent (B1) includes the compound represented by the above formula (1) or a carbonate compound, and has a standard boiling point of no less than 150.0° C. Due to containing the above-specified organic solvent that is a component having a higher boiling point, the composition for forming a resist underlayer film has superior storage stability enabling a change of a film thickness of the resist underlayer film accompanied by storage of the composition to be decreased, and also has a superior improving property on coating defects enabling hardening of the polymer components dissolving in the composition to be suppressed by prohibiting unwanted evaporation of the solvent in the step of providing a resist underlayer film.

The standard boiling point of the organic solvent (B1) is preferably no less than 160° C., more preferably no less than 170° C., and still more preferably no less than 180° C. When the standard boiling point of the organic solvent (B1) falls within the above range, the storage stability and the improving property on coating defects of the composition can be improved.

The standard boiling point of the organic solvent (B1) is preferably no greater than 300° C., more preferably no greater than 280° C., still more preferably no greater than 250° C., and particularly preferably no greater than 220° C. When the standard boiling point of the organic solvent (B1) falls within the above range, residues of the organic solvent after providing the resist underlayer film can be decreased.

In the above formula (1), $R^1$ and $R^2$ each independently represent a hydrogen atom, an alkyl group having 1 to 4 carbon atoms or an acyl group having 1 to 4 carbon atoms; $R^3$ represents a hydrogen atom or a methyl group; n is an integer of 1 to 4, wherein in a case where n is 2 or greater, a plurality of $R^3$s are the same or different.

Examples of the alkyl group having 1 to 4 carbon atoms represented by the $R^1$ and $R^2$ include linear alkyl groups such as a methyl group, an ethyl group, a n-propyl group and a n-butyl group; branched alkyl groups such as an isopropyl group, an isobutyl group, a sec-butyl group and a t-butyl group, and the like.

Examples of the acyl group having 1 to 4 carbon atoms represented by the $R^1$ and $R^2$ include a formyl group, an acetyl group, a propionyl group, and the like.

Examples of the organic solvent (B1) consisting of the compound represented by the above formula (1) include polyhydric alcohol compounds such as ethylene glycol (boiling point: 197° C.), 1,2-propylene glycol (boiling point: 188° C.) and triethylene glycol (boiling point: 165° C.);

partially etherified polyhydric alcohol compounds such as ethylene glycol monopropyl ether (boiling point: 150° C.), ethylene glycol monobutyl ether (boiling point: 171° C.), ethylene glycol monophenyl ether (boiling point: 244° C.), diethylene glycol monomethyl ether (boiling point: 194° C.), diethylene glycol monoethyl ether (boiling point: 202° C.), triethylene glycol monomethyl ether (boiling point: 249° C.), diethylene glycol monoisopropyl ether (boiling point: 207° C.), diethylene glycol monobutyl ether (boiling point: 231° C.), triethylene glycol monobutyl ether (boiling point: 271° C.), ethylene glycol monoisobutyl ether (boiling point: 161° C.), diethylene glycol monoisobutyl ether (boiling point: 220° C.), dipropylene glycol monomethyl ether (boiling point: 187° C.), tripropylene glycol monomethyl ether (boiling point: 242° C.), dipropylene glycol monopropyl ether (boiling point: 212° C.), propylene glycol monobutyl ether (boiling point: 170° C.) and dipropylene glycol monobutyl ether (boiling point: 231° C.);

ether compounds such as diethylene glycol dimethyl ether (boiling point: 162° C.), triethylene glycol dimethyl ether (boiling point: 216° C.), diethylene glycol methyl ethyl ether (boiling point: 176° C.), diethylene glycol diethyl ether (boiling point: 189° C.), diethylene glycol dibutyl ether (boiling point: 255° C.), dipropylene glycol dimethyl ether (boiling point: 171° C.), diethylene glycol monoethyl ether acetate (boiling point: 217° C.) and ethylene glycol monobutyl ether acetate (boiling point: 188° C.), and the like.

Examples of the organic solvent (B1) consisting of a carbonate compound include ethylene carbonate (boiling point: 244° C.), propylene carbonate (boiling point: 242° C.), and the like.

The relative permittivity of the organic solvent (B1) is preferably 13 or greater and 200 or less. When the organic solvent (B1) has a relative permittivity falling within the above range, the composition can have further improved solubility of the polysiloxane (A), and as a result, the improving property on coating defects can be improved. It is to be noted that the "relative permittivity" means the ratio of the dielectric constant of an organic solvent to the dielectric constant of a vacuum. With respect to the relative permittivity of a compound, a value described in "Chemical Handbook: Basic Edition; Revised 5th Edition", etc., may be referred to. As the relative permittivity of a compound not described in the Chemical Handbook, a value obtained by determining at 20° C. by a method described in JIS C2138 may be referred to.

Examples of the organic solvent (B1) having the relative permittivity falling within the above range include carbonate compounds such as ethylene carbonate (relative permittivity: 90) and propylene carbonate (relative permittivity: 63); ethylene glycol (relative permittivity: 41), and the like.

The static surface tension of the organic solvent (B1) is preferably no less than 20 mN/m and no greater than 50 mN/m. The static surface tension of the organic solvent (B1) is more preferably no less than 20 mN/m and no greater than 40 mN/m, and still more preferably no less than 20 mN/m and no greater than 30 mN/m. When the static surface tension of the organic solvent (B1) falls within the above range, the composition can have further improved solubility of the polysiloxane (A), and as a result, the improving property on coating defects can be improved.

Examples of the organic solvent (B1) having the static surface tension falling within the above range include diethylene glycol monomethyl ether (static surface tension: 29.8 mN/m), triethylene glycol monomethyl ether (static surface tension: 31.9 mN/m), diethylene glycol monoisopropyl ether (static surface tension: 29.9 mN/m), ethylene glycol monobutyl ether (static surface tension: 24.0 mN/m), diethylene glycol monobutyl ether (static surface tension: 26.2 mN/m), triethylene glycol monobutyl ether (static surface tension: 27.7 mN/m), ethylene glycol monoisobutyl ether (static surface tension: 22.5 mN/m), diethylene glycol monoisobutyl ether (static surface tension: 24.6 mN/m), dipropylene glycol monomethyl ether (static surface tension: 25.1 mN/m), tripropylene glycol monomethyl ether (static surface tension: 25.7 mN/m), dipropylene glycol monopropyl ether (static surface tension: 27.9 mN/m), propylene glycol monobutyl ether (static surface tension: 26.8 mN/m), dipropylene glycol monobutyl ether (static surface tension: 23.7 mN/m), diethylene glycol dimethyl ether (static surface tension: 25.3 mN/m), triethylene glycol dimethyl ether (static surface tension: 27.5 mN/m), diethylene glycol methyl ethyl ether (static surface tension: 24.0 mN/m), diethylene glycol diethyl ether (static surface tension: 23.3 mN/m), diethylene glycol dibutyl ether (static surface tension: 23.6 mN/m), dipropylene glycol dimethyl ether (static surface tension: 21.1 mN/m), diethylene glycol monoethyl ether acetate (static surface tension: 26.2 mN/m), and the like.

The content of the organic solvent (B1) in the solvent composition (B) is preferably no less than 1% by mass and no greater than 50% by mass, more preferably no less than 1.5% by mass and no greater than 30% by mass, and still more preferably no less than 2% by mass and no greater than 20% by mass. When the content of the organic solvent (B1) in the solvent composition (B) falls within the above range, the storage stability and the improving property on coating defects of the composition can be effectively improved.

(B2) Compound

The compound (B2) is an alkylene glycol monoalkyl ether acetate compound having a standard boiling point of less than 150.0° C. The compound (B2) is preferably a propylene glycol monoalkyl ether acetate compound. When the compound (B2) is the above-specified compound, the composition can have further improved solubility of the polysiloxane (A) in the solvent composition (B), and as a result, storage stability and improving property on coating defects can be further improved.

Examples of the compound (B2) include: ethylene glycol monoalkyl ether compounds such as ethylene glycol monomethyl ether acetate (boiling point: 145° C.); propylene glycol monoalkyl ether acetate compounds such as propylene glycol monomethyl ether acetate (boiling point: 146° C.), and the like. Of these, propylene glycol monoalkyl ether acetate compounds are preferred, and propylene glycol monomethyl ether acetate is more preferred.

The content of the compound (B2) in the solvent composition (B) is preferably no less than 10% by mass and no greater than 99% by mass, and more preferably no less than 50% by mass and no greater than 99% by mass. When the content of the compound (B2) falls within the above range, solubility of the polysiloxane (A) in the solvent composition (B) can be effectively improved.

Other Solvent

The solvent composition (B) may contain other solvent excluding the organic solvent (B1) and the compound (B2) (for example, (B3) an organic solvent and/or (B4) water, etc., i.e., an organic solvent other than the organic solvent (B1) and compound (B2)) within a range not leading to impairment of the effects of the present invention.

Examples of the organic solvent (B3) include ethylene glycol alkyl ether compounds such as ethylene glycol monomethyl ether (boiling point: 125° C.), ethylene glycol monoethyl ether (boiling point: 135° C.), ethylene glycol monoisopropyl ether (boiling point: 142° C.), ethylene glycol dimethyl ether (boiling point: 82° C.) and ethylene glycol diethyl ether (boiling point: 121° C.); propylene glycol alkyl ether compounds such as propylene glycol-1-methyl ether (boiling point: 120° C.), propylene glycol-1-ethyl ether (boiling point: 133° C.) and propylene glycol-1-propyl ether (boiling point: 149.8° C.), and the like. Of these, propylene glycol alkyl ether compounds are preferred, propylene glycol-1-methyl ether, propylene glycol-1-ethyl ether and propylene glycol-1-propyl ether are more preferred, and propylene glycol-1-ethyl ether is still more preferred.

The content of the other solvent in the solvent composition (B) is preferably no greater than 70% by mass, and more preferably no greater than 50% by mass.

Acid Diffusion Control Agent (C)

The acid diffusion control agent (C) is a component that inhibits diffusion of an acid generated in a resist film upon exposure. When the composition for forming a resist underlayer film of the embodiment of the present invention further contains the acid diffusion control agent (C), diffusion of an acid in the resist film which may be caused via the resist underlayer film can be effectively inhibited while maintaining the effects described above. As a result, the shape of a resist pattern formed by a multilayer resist process can be improved. It is to be noted that the acid diffusion control agent (C) may be used either alone or in combination of two or more types thereof.

The acid diffusion control agent (C) is preferably a nitrogen-containing compound. When the acid diffusion control agent (C) is a nitrogen-containing compound, the composition enables the diffusion to be more effectively inhibited, and as a result, the shape of the resist pattern formed by the multilayer resist process can be further improved.

The nitrogen-containing compound is exemplified by an amine compound, an amide group-containing compound, an urea compound, a nitrogen-containing heterocyclic compound, and the like.

Examples of the amine compound include: mono(cyclo)alkylamines; di(cyclo)alkylamines; tri(cyclo)alkylamines; substituted alkylaniline or derivatives thereof; ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis(1-(4-aminophenyl)-1-methylethyl)benzene, 1,3-bis(1-(4-aminophenyl)-1-methylethyl)benzene, bis(2-dimethylaminoethyl)ether, bis(2-diethylaminoethyl)ether, 1-(2-hydroxyethyl)-2-imidazolidinone, 2-quinoxalinol, N,N,N',N'-tetrakis(2-hydroxypropyl)ethylenediamine, N,N,N',N''N''-pentamethyldiethylenetriamine, and the like.

Examples of the amide group-containing compound include: N-t-butoxycarbonyl group-containing amino compounds such as N-t-butoxycarbonyl-4-hydroxypiperidine, N-t-butoxycarbonyl-2-carboxy-4-hydroxypyrrolidine and N-t-butoxycarbonyl-2-carboxypyrrolidine; N-t-amyloxycarbonyl group-containing amino compounds such as N-t-amyloxycarbonyl-4-hydroxypiperidine; N-(9-anthranilmethyloxycarbonyl) group-containing amino compounds such as N-(9-anthranilmethyloxycarbonyl)piperidine; formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, and the like.

Examples of the urea compound include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compound include: pyridines; piperazines; pyrazine, pyrazole, pyridazine, quinoxaline, purine, pyrrolidine, piperidine, piperidine ethanol, 3-(N-piperidino)-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

Of these, an amide group-containing compound is preferred. An N-t-butoxycarbonyl group-containing amino compound and an N-t-amyloxycarbonyl group-containing amino compound are more preferred, and N-t-butoxycarbonyl-4-hydroxypiperidine, N-t-butoxycarbonyl-2-carboxy-4-hydroxypyrrolidine, N-t-butoxycarbonyl-2-carboxy-pyrrolidine and N-t-amyloxycarbonyl-4-hydroxypiperidine are particularly preferred.

The content of the acid diffusion control agent (C) is preferably 0.1 parts by mass to 10 parts by mass, and more preferably 1 part by mass to 5 parts by mass with respect to 100 parts by mass of the polysiloxane (A). When the content falls within the above range, the shape of the resist pattern can be improved.

Other Optional Component

The composition for forming a resist underlayer film may contain other optional components such as colloidal silica, colloidal alumina, an organic polymer and a surfactant. The other optional components may be each used either alone or in combination of two or more types thereof. Moreover, the content of the other optional component may be appropriately selected in accordance with the purpose therefor.

Examples of the organic polymer include polymers of an acrylate compound, a methacrylate compound, or an aromatic vinyl compound; vinylamide polymers, dendrimers, polyimides, polyamic acids, polyarylenes, polyamides, polyquinoxalines, polyoxadiazoles, fluorine polymers, and the like.

The surfactant is exemplified by a nonionic surfactant, an anionic surfactant, a cationic surfactant, an amphoteric surfactant, a silicone surfactant, a polyalkyleneoxide surfactant, a fluorine-containing surfactant, and the like.

Preparation Method of Composition for Forming a Resist Underlayer Film

The composition for forming a resist underlayer film of the embodiment of the present invention may be prepared by mixing the polysiloxane (A) and the solvent composition (B), and as needed the acid diffusion control agent (C) and the other optional component(s), etc., at a predetermined ratio.

Pattern-Forming Method

The pattern-forming method of the embodiment of the present invention includes the steps of:

providing a resist underlayer film on a substrate using the composition for forming a resist underlayer film (hereinafter, may be also referred to as "resist underlayer film-providing step");

providing a resist film on the resist underlayer film using a resist composition (hereinafter, may be also referred to as "resist film-providing step");

exposing the resist film by irradiation with an exposure light through a photomask (hereinafter, may be also referred to as "exposure step");

developing the exposed resist film to form a resist pattern (hereinafter, may be also referred to as "development step"); and sequentially dry-etching the resist underlayer film and the substrate using the resist pattern as a mask (hereinafter, may be also referred to as "dry-etching step").

According to the pattern-forming method of the embodiment of the present invention, since the composition for forming a resist underlayer film has the properties described in the foregoing, a favorable resist pattern can be formed.

Resist Underlayer Film-Providing Step

In this step, a resist underlayer film is provided on a substrate using the composition for forming a resist underlayer film. Examples of the substrate include a silicon wafer, a wafer coated with aluminum, and the like.

With respect to a method for providing the resist underlayer film, for example, a coated film of the composition for forming a resist underlayer film may be provided by coating on the surface of a substrate and/or other underlayer film described later, etc., and the coated film may be subjected to a heat treatment, or both irradiation with an ultraviolet ray and a heat treatment to allow for hardening, whereby the resist underlayer film can be provided. The method for coating the composition for forming a resist underlayer film is exemplified by a spin-coating method, a roll coating method, a dipping method, and the like. In addition, the heating temperature is typically 50° C. to 450° C., and preferably 150° C. to 300° C. The heating time period is typically 5 sec to 600 sec.

It is to be noted that the substrate may be provided beforehand with other underlayer film that is different from the resist underlayer film provided using the composition for forming a resist underlayer film of the embodiment of the present invention (hereinafter, may be also referred to as "other underlayer film"). The other underlayer film is exemplified by organic antireflective films disclosed in Japanese Examined Patent Application, Publication No. H6-12452 and Japanese Unexamined Patent Application, Publication No. S59-93448, etc., and the like.

The film thickness of the resist underlayer film is typically 10 nm to 1,000 nm, and preferably 10 nm to 500 nm.

Resist Film-Providing Step

In this step, a resist film is provided on the resist underlayer film using a resist composition. Specifically, after coating the resist composition such that the resultant resist film has a predetermined film thickness, the solvent in the coated film is volatilized by prebaking to provide the resist film.

The resist composition is exemplified by a positive or negative chemically amplified type resist composition containing an acid generating agent, a positive type resist composition constituted with an alkali-soluble resin and a quinone diazide based photosensitizing agent, a negative type resist composition constituted with an alkali-soluble resin and a crosslinking agent, and the like.

The total solid content of the resist composition is typically 1% by mass to 50% by mass. In addition, the resist composition is generally employed for providing the resist film after filtering through a filter having a pore size of about 0.2 μm, for example. It is to be noted that a commercially available resist composition may be used as is in this step.

The coating method of the resist composition is not particularly limited, and for example, a spin coating method or the like may be employed. In addition, the temperature of the prebaking may be appropriately adjusted according to the type and the like of the resist composition used, but is usually 30° C. to 200° C., and preferably 50° C. to 150° C.

Exposure Step

In this step, the resist film is exposed by irradiation with an exposure light through a photomask. The exposure light is appropriately selected in accordance with the type of the photoacid generating agent used in the resist composition from among visible light rays, ultraviolet rays, far ultraviolet rays, X-rays and the like. Of these, far ultraviolet rays are preferred; a KrF excimer laser beam (wavelength: 248 nm), an ArF excimer laser beam (wavelength: 193 nm), an $F_2$ excimer laser beam (wavelength: 157 nm), a $Kr_2$ excimer laser beam (wavelength: 147 nm), an ArKr excimer laser beam (wavelength: 134 nm), an extreme ultraviolet ray (wavelength: 13 nm, etc.) are more preferred; and an ArKr excimer laser beam (wavelength: 134 nm) is particularly preferred.

After the exposure, post-baking may be carried out for improving resolution, pattern profile, developability, and the like. The temperature of the post-baking is appropriately adjusted in accordance with the type of the resist composition used, which is typically 50° C. to 200° C., and preferably 70° C. to 150° C.

Development Step

In this step, the exposed resist film is developed to form a resist pattern. The developer solution for use in this step is appropriately selected in accordance with the type of the resist composition used. Examples of the developer solution include aqueous alkaline solutions of sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethyl ethanolamine, triethanolamine, tetraethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene or the like. An appropriate amount of a water-soluble organic solvent, for example, an alcohol such as methanol or ethanol, as well as a surfactant, etc., may be optionally added to these aqueous alkaline solutions.

After the development with the aforementioned developer solution, the resist film is washed and dried to form a predetermined resist pattern.

Dry-Etching Step

In this step, the resist underlayer film and the substrate are sequentially dry-etched using the resist pattern as a mask. The dry etching may be effected using any well-known dry etching apparatus. In addition, depending on the elemental composition of the object to be etched, oxygen atom-containing gases such as $O_2$, CO, and $CO_2$, inert gases such as He, $N_2$, and Ar, chlorine based gases such as $Cl_2$ and $BCl_4$, fluorine based gases such as $CHF_3$ and $CF_4$, other gases such as $H_2$ and $NH_3$ can be used as a source gas in the dry etching. It is to be noted that these gases may also be used in mixture.

In addition, the pattern-forming method may include a step of removing a resist underlayer film remaining on the substrate after these processes. It is to be noted that the resist pattern may be formed by a nanoimprinting or the like, without undergoing a step of the development.

EXAMPLES

Hereinafter, the present invention will be explained more specifically by way of Examples, but the present invention is not limited thereto. Measurements of the solid content concentration and the polystyrene equivalent weight average molecular weight (Mw) of a polysiloxane were conducted according to the following method.

Solid Content Concentration of Polysiloxane

A solution containing a polysiloxane in an amount of 0.5 g was baked at 250° C. for 30 min, and the mass of the resulting solid content was measured to determine the solid content concentration (% by mass) of the polysiloxane.

Polystyrene Equivalent Weight Average Molecular Weight (Mw)

The polystyrene equivalent weight average molecular weight (Mw) was determined by gel permeation chromatography (GPC) using GPC columns (G2000HXL×2; G3000HXL×1; and G4000HXL×1, manufactured by Tosoh Corporation) under an analytical condition involving a flow rate of 1.0 mL/min and a column temperature of 40° C. with tetrahydrofuran as an elution solvent, with mono-dispersed polystyrene as a standard.

Synthesis of Polysiloxane (A)

The polysiloxane (A) was synthesized using the following silane compounds.
M-1: tetramethoxysilane
M-2: phenyltrimethoxysilane
M-3: 4-methylphenyltrimethoxysilane
M-4: methyltrimethoxysilane Synthesis Example 1

Synthesis of Polysiloxane (A-1)

An aqueous oxalic acid solution was prepared by dissolving 0.55 g of oxalic acid in 7.66 g of water. Thereafter, a flask charged with 12.95 g (60 mol %) of M-1, 5.80 g (30 mol %) of M-2, 3.01 g (10 mol %) of M-3 and 70.03 g of propylene glycol-1-ethyl ether was fitted with a condenser and a dropping funnel containing the aqueous oxalic acid solution. Next, after heating the flask to 60° C. in an oil bath, the aqueous oxalic acid solution was slowly added dropwise to permit a reaction at 60° C. for 2 hrs. After completion of the reaction, the flask containing the reaction solution was allowed to cool, and fitted with an evaporator. The remaining water and methanol generated by the reaction were removed to obtain 49.2 g of a solution containing polysiloxane (A-1) as a solid matter. The solid content concentration of the solution was 15% by mass, and the Mw of the polysiloxane (A-1) was 1,500.

Synthesis Example 2

Synthesis of Polysiloxane (A-2)

A solution containing polysiloxane (A-2) was synthesized in a similar manner to Synthesis Example 1 except that each monomer that gives the polysiloxane (A) was used in amounts shown in Table 1. The solid content concentration of the polysiloxane (A-2) in the solution containing the obtained polysiloxane (A-2) and the Mw are shown in Table 1.

Synthesis Example 3

Synthesis of Polysiloxane (A-3)

An aqueous oxalic acid solution was prepared by dissolving 1.28 g of oxalic acid in 12.85 g of water with heating. Thereafter, a flask charged with 25.05 g of M-1 (90 mol %), 3.63 g of M-2 (10 mol %) and 57.19 g of propylene glycol-1-ethyl ether was fitted with a condenser and a dropping funnel containing the aqueous oxalic acid solution. Next, after heating the flask to 60° C. in an oil bath, the aqueous oxalic acid solution was slowly added dropwise to permit a reaction at 60° C. for 4 hrs. After completion of the reaction, the flask containing the reaction solution was allowed to cool, and then fitted with an evaporator. The remaining water and methanol generated were removed to obtain 97.3 g of a solution containing (A-3) a polysiloxane as a solid matter. The solid content concentration of the polysiloxane (A-3) in the solution was 18% by mass, and the Mw of the polysiloxane (A-3) was 2,000.

TABLE 1

| | (A) Polysiloxane | Monomer that gives the polysiloxane (A) | | | Solid content concentration (% by mass) | Mw |
|---|---|---|---|---|---|---|
| | | type | Using amount (g) | (mol %) | | |
| Synthesis Example 1 | A-1 | M-1 | 12.95 | 60 | 15 | 1,500 |
| | | M-2 | 5.80 | 30 | | |
| | | M-3 | 3.01 | 10 | | |
| Synthesis Example 2 | A-2 | M-1 | 15.97 | 50 | 14 | 2,000 |
| | | M-2 | 12.87 | 45 | | |
| | | M-4 | 2.08 | 5 | | |
| Synthesis Example 3 | A-3 | M-1 | 25.05 | 90 | 18 | 2,000 |
| | | M-2 | 3.63 | 10 | | |

Preparation of Composition for Forming a Resist Underlayer Film

Each component other than the polysiloxane (A) is shown below.

(B) Solvent Composition
(B1) Organic Solvent
B1-1: ethylene glycol monobutyl ether
(standard boiling point: 171° C., static surface tension: 24.0 mN/m)
B1-2: diethylene glycol diethyl ether
(standard boiling point: 189° C., static surface tension: 23.3 mN/m)
B1-3: diethylene glycol monomethyl ether
(standard boiling point: 194° C., static surface tension: 29.8 mN/m)
B1-4: diethylene glycol monoethyl ether acetate
(standard boiling point: 217° C., static surface tension: 26.2 mN/m)
(B2) Compound
B2: propylene glycol monomethyl ether acetate
(standard boiling point: 146° C.)
Other Solvent
B3: propylene glycol-1-ethyl ether
(standard boiling point: 133° C.)
B4: water
(C) Acid Diffusion Control Agent
Compounds represented by the following formulae (C-1) to (C-4)

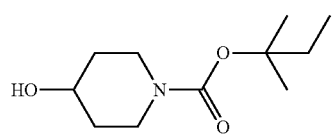

(C-1)

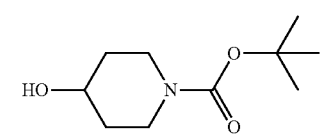

(C-2)

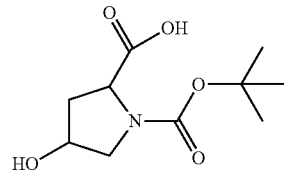

(C-3)

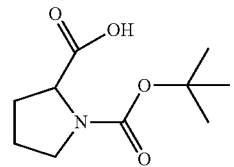

(C-4)

Example 1

A composition for forming a resist underlayer film was prepared by blending 1.94 parts by mass of A-1 as the polysiloxane (A), 4.88 parts by mass of B1-1 as the organic solvent (B1), 68.32 parts by mass of B2 as the compound (B2), 24.40 parts by mass of B3 and 0.4 parts by mass of B4 as the other solvent, and 0.06 parts by mass of C-1 as the acid diffusion control agent (C-1).

Examples 2 to 12, and Comparative Examples 1 to 4

Each composition for forming a resist underlayer film was prepared in a similar manner to Example 1 except that the type and the amount of each component blended were as shown in Table 2. It is to be noted that "-" in Table 2 denotes that the corresponding component was not blended.

TABLE 2

| | (A) Polysiloxane | | (B1) Organic solvent | | (B2) Compound | | Other solvent | | | | (C) Acid | |
|---|---|---|---|---|---|---|---|---|---|---|---|---|
| | type | amount blended (parts by mass) | type | amount blended (parts by mass) | type | amount blended (parts by mass) | type | amount blended (parts by mass) | type | amount blended (parts by mass) | diffusion control agent | (parts by mass) |
| Example 1 | A-1 | 1.94 | B1-1 | 4.88 | B2 | 68.32 | B3 | 24.40 | B4 | 0.4 | C-1 | 0.06 |
| Example 2 | A-1 | 1.94 | B1-2 | 4.88 | B2 | 68.32 | B3 | 24.40 | B4 | 0.4 | C-2 | 0.06 |
| Example 3 | A-2 | 1.94 | B1-3 | 4.88 | B2 | 68.32 | B3 | 24.40 | B4 | 0.4 | C-3 | 0.06 |
| Example 4 | A-3 | 1.94 | B1-4 | 4.88 | B2 | 68.32 | B3 | 24.40 | B4 | 0.4 | C-4 | 0.06 |
| Example 5 | A-1 | 1.94 | B1-1 | 4.90 | B2 | 68.60 | B3 | 24.50 | — | — | C-1 | 0.06 |
| Example 6 | A-1 | 1.94 | B1-2 | 4.90 | B2 | 68.60 | B3 | 24.50 | — | — | C-2 | 0.06 |
| Example 7 | A-2 | 1.94 | B1-3 | 4.90 | B2 | 68.60 | B3 | 24.50 | — | — | C-3 | 0.06 |
| Example 8 | A-3 | 1.94 | B1-4 | 4.90 | B2 | 68.60 | B3 | 24.50 | — | — | C-4 | 0.06 |
| Example 9 | A-1 | 1.94 | B1-1 | 4.65 | — | — | B3 | 88.35 | B4 | 5.0 | C-1 | 0.06 |
| Example 10 | A-1 | 1.94 | B1-2 | 4.65 | — | — | B3 | 88.35 | B4 | 5.0 | C-2 | 0.06 |
| Example 11 | A-2 | 1.94 | B1-3 | 4.40 | — | — | B3 | 83.60 | B4 | 10.0 | C-3 | 0.06 |
| Example 12 | A-3 | 1.94 | B1-4 | 4.40 | — | — | B3 | 83.60 | B4 | 10.0 | C-4 | 0.06 |
| Comparative Example 1 | A-1 | 1.94 | — | — | B2 | 68.32 | B3 | 29.28 | B4 | 0.4 | C-1 | 0.06 |
| Comparative Example 2 | A-2 | 1.94 | — | — | B2 | 68.32 | B3 | 29.28 | B4 | 0.4 | C-2 | 0.06 |
| Comparative Example 3 | A-1 | 1.94 | — | — | B2 | 68.60 | B3 | 29.40 | — | — | C-1 | 0.06 |
| Comparative Example 4 | A-2 | 1.94 | — | — | B2 | 68.60 | B3 | 29.40 | — | — | C-2 | 0.06 |

Evaluations

The compositions for forming a resist underlayer film prepared as described above were evaluated according to the following methods. The results of the evaluations are shown in Table 3.

Initial Inhibitory Property on Coating Defects

Each composition for forming a resist underlayer film immediately after the preparation was coated on a silicon wafer that serves as a substrate by a spin coating method using a coater/developer (CLEAN TRACK ACT12, manufactured by Tokyo Electron Limited), and then the coated film obtained was dried at 220° C. for 60 sec, followed by cooling to 23° C. to provide a resist underlayer film having a film thickness of 30 nm. The film thickness was measured using an optical film thickness meter (UV-1280SE, manufactured by KLA Tencor). Thereafter, coating defects were determined using a surface defect inspection device (trade name "KLA2800", manufactured by KLA Tencor), and the determined results were defined for an evaluation of improving property on coating defects (immediately after preparation). In these regards, the improving property on coating defects (immediately after preparation) was evaluated as: favorable "A" when the number of coating defects was no greater than 100; and unfavorable "B" when the number of coating defects exceeded 100.

Evaluation on Storage Stability (1)

Inhibitory Property on Change of the Film Thickness with Time

Each composition for forming a resist underlayer film was coated on the surface of a silicon wafer using a spin coater under a condition involving a number of revolution of 2,000 rpm for 20 sec, and dried on a hot plate at 250° C. for 60 sec to provide each resist underlayer film. The film thickness of each of the provided resist underlayer films was measured using the optical film thickness meter at 50 points, and the average film thickness was calculated, which was defined as initial film thickness (T0). Moreover, using each composition for forming a resist underlayer film after heating at 80° C. for 5 hrs, each resist underlayer film was provided similarly to the foregoing, and the film thickness of the resultant film was measured. The average film thickness was calculated, which was defined as film thickness after storage (T). Then the difference (T−T0) between the initial film thickness T0 and the film thickness after storage T was calculated, and the proportion of the difference with respect to the initial film thickness T0, i.e., "(T−T0)/T0" was calculated as a rate of change of the film thickness. According to the calculated value, evaluation was made as:"A" when the value was no greater than 8%; "B" when the value was greater than 8% and no greater than 10%; and "C" when the value was greater than 10%.

Evaluation on Storage Stability (2)

Inhibitory Property on Coating Defects with Time

After each composition for forming a resist underlayer film prepared was stored at 40° C. for one week, the resist underlayer film was provided and coating defects thereof were determined by a similar method to that shown in the "improving property on coating defects (immediately after preparation)" using each composition after the storage. The results of the determination were defined for an evaluation of the improving property on coating defects (after storage). In these regards, the improving property on coating defects (after storage) was evaluated as: favorable "A" when the number of coating defects was no greater than 100; and unfavorable "B" when the number of coating defects exceeded 100.

TABLE 3

| | Storage stability | | |
|---|---|---|---|
| | Initial inhibitory property on coating defects | Inhibitory property on change of the film thickness with time | Inhibitory property on coating defects with time |
| Example 1 | A | A | A |
| Example 2 | A | A | A |
| Example 3 | A | A | A |
| Example 4 | A | A | A |
| Example 5 | A | A | A |
| Example 6 | A | A | A |
| Example 7 | A | A | A |
| Example 8 | A | A | A |
| Example 9 | A | A | A |
| Example 10 | A | A | A |
| Example 11 | A | A | A |
| Example 12 | A | A | A |
| Comparative Example 1 | B | A | B |
| Comparative Example 2 | B | A | B |
| Comparative Example 3 | B | A | B |
| Comparative Example 4 | B | A | B |

As is seen from the results shown in Table 3, the improving property on coating defects, and the storage stability (i.e., inhibitory property on change of the film thickness with time, and inhibitory property on coating defects with time) were both favorable according to Examples. To the contrary, insufficient improving property on coating defects (immediately after preparation; and after storage) were found according to some Comparative Examples.

According to the embodiment of the present invention, provided are: a composition for forming a resist underlayer film having superior storage stability and a superior improving property on coating defects enabling occurrence of coating defects to be suppressed; and a pattern-forming method in which the composition is used. Therefore, the composition for forming a resist underlayer film and a pattern-forming method can be suitably used in manufacturing processes of semiconductor devices in which miniaturization of patterns has been in progress.

Obviously, numerous modifications and variations of the present invention are possible in light of the above teachings. It is therefore to be understood that within the scope of the appended claims, the invention may be practiced otherwise than as specifically described herein.

What is claimed is:

1. A composition for forming a resist underlayer film, comprising:

a polysiloxane;

an acid diffusion control agent capable of inhibiting diffustion of an acid; and a solvent composition capable of dissolving the polysiloxane, the solvent composition comprising:

an organic solvent which comprises a compound represented by formula (1) or a carbonate compound and which has a standard boiling point of no less than 150.0° C., includes a compound

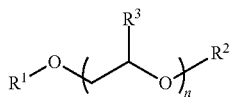 (1)

wherein, in the formula (1), $R^1$ and $R^2$ each independently represent an alkyl group having 1 to 4 carbon atoms or an acyl group having 1 to 4 carbon atoms; $R^3$ represents a hydrogen atom or a methyl group; n is an integer of 1 to 4, in a case where n is no less than 2, a plurality of $R^3$s are identical or different; a content of the organic solvent in the solvent composition is no less than 1% by mass and no greater than 50% by mass; and wherein the solvent composition further comprises an alkylene glycol monoalkyl ether acetate compound having a standard boiling point of less than 150.0° C., a content of no less than 50% by mass and no greater than 99% by mass.

2. The composition according to claim 1, wherein the standard boiling point of the organic solvent is no less than 180° C.

3. The composition according to claim 1, wherein a static surface tension of the organic solvent is no less than 20 mN/m and no greater than 50 mN/m.

4. The composition according to claim 1, wherein the alkylene glycol monoalkyl ether acetate compound is a propylene glycol monoalkyl ether acetate compound.

5. The composition according to claim 1, which is used for is a multilayer resist process.

6. The composition according to claim 1, wherein the acid diffusion control agent is a nitrogen-containing compound.

7. The composition according to claim 1, wherein the polysiloxane is a hydrolytic condensate of a compound comprising a silane compound represented by a formula (i):

 (i)

wherein, in the formula (i), $R^A$ represents a hydrogen atom, a fluorine atom, an alkyl group having 1 to 5 carbon atoms, an alkenyl group having 2 to 20 carbon atoms, an aryl group having 6 to 20 carbon atoms or a cyano group, wherein a part or all of hydrogen atoms of the alkyl group represented by $R^A$ are not substituted or substituted by an epoxyalkyloxy group, an acid anhydride group or a cyano group, and a part or all of hydrogen atoms of the aryl group are not substituted or substituted by a hydroxy group; X represents a halogen atom or —$OR^B$, wherein $R^B$ represents a monovalent organic group; a is an integer of 0 to 3, wherein in a case where $R^A$ is present in a plurality of number, the plurality of $R^A$s are each identical or different, and in a case where X is present in a plurality of number, the plurality of Xs are each identical or different.

8. The composition according to claim 7, wherein the organic solvent comprises the compound represented by the formula (1).

9. The composition according to claim 7, wherein the organic solvent comprises the carbonate compound.

10. The composition according to claim 1, wherein the organic solvent comprises the compound represented by the formula (1).

11. The composition according to claim 1, wherein the organic solvent comprises the carbonate compound.

12. The composition according to claim 1, wherein the organic solvent comprises the compound represented by the formula (1).

13. The composition according to claim 1, wherein the organic solvent comprises the carbonate compound.

14. The composition according to claim 1, wherein the acid diffusion control agent is an amide group-containing compound.

15. A pattern-forming method comprising:
providing a resist underlayer film on a substrate using the composition according to claim 1;
providing a resist film on the resist underlayer film using a resist composition;
exposing the resist film by irradiation with an exposure light through a photomask;
developing the exposed resist film to form a resist pattern; and
sequentially dry-etching the resist underlayer film and the substrate using the resist pattern as a mask.

* * * * *